(12) United States Patent
Lovejoy

(10) Patent No.: US 8,431,957 B2
(45) Date of Patent: Apr. 30, 2013

(54) AUDIO DOSAGE CONTROL

(75) Inventor: Kim Lovejoy, Waukesha, WI (US)

(73) Assignee: Beaumont Freidman & Co., Geneva (CH)

( * ) Notice: Subject to any disclaimer, the term of this patent is extended or adjusted under 35 U.S.C. 154(b) by 1037 days.

(21) Appl. No.: 12/066,850

(22) PCT Filed: Sep. 15, 2006

(86) PCT No.: PCT/EP2006/066426
§ 371 (c)(1),
(2), (4) Date: Aug. 29, 2008

(87) PCT Pub. No.: WO2007/031582
PCT Pub. Date: Mar. 22, 2007

(65) Prior Publication Data
US 2009/0092265 A1    Apr. 9, 2009

(30) Foreign Application Priority Data
Sep. 15, 2005   (GB) .................................. 0518864.4

(51) Int. Cl.
*H03G 3/00*         (2006.01)
(52) U.S. Cl.
USPC ........... 257/104; 381/105; 381/106; 381/107; 381/108; 381/109; 381/110
(58) Field of Classification Search .................. 381/104, 381/105, 106, 107, 108, 109, 110
See application file for complete search history.

(56) References Cited

U.S. PATENT DOCUMENTS 5,046,101 A * 9/1991 Lovejoy ........................... 381/57
2001/0040968 A1* 11/2001 Mukojima ...................... 381/17
2003/0191609 A1  10/2003 Bernardi et al.

FOREIGN PATENT DOCUMENTS
EP           0529158       3/1993

OTHER PUBLICATIONS

Veronique Zimpfer, "Amelioration du traitement numerique des signaux dans les systemes actifs en protection auditive", Dec. 19, 2000, Paragraph 3 on pp. 26-30.

* cited by examiner

*Primary Examiner* — Kimberly Rizkallah
*Assistant Examiner* — Timor Karimy
(74) *Attorney, Agent, or Firm* — Young & Thompson

(57) ABSTRACT

A method for controlling consumer exposure to audio dosage for a composite audio signal, the method comprising: sampling the composite audio signal; transforming the sampled audio signal, using a fast fourier transform algorithm, to produce a signal representative of the amplitude of component frequencies of the audio signal; comparing the transformed audio signal with a predefined impulse control threshold profile, representing the target maximum amplitude for each frequency component for the audio signal threshold profile to produce a configuring signal representative of the difference between the broadcast signal and the profile; using the configuring signal to automatically configure in real time a Finite Impulse Response (FIR) filter so that it attenuates the amplitude of the transformed audio signal in frequency bands centered on the frequencies at which the target threshold is exceeded; and outputting the attenuated audio signal for consumer exposure.

21 Claims, 9 Drawing Sheets

AUDIO DOSAGE CONTROL

The present invention relates to audio dosage control, for example to control the audio output of loud speakers at public concerts, or the audio feed to headphones in personal music players.

BACKGROUND

Performers at public music concerts typically use powerful amplification systems which output very high noise levels. This can cause damage to the hearing of members of the audience as well as to sound technicians and other personnel who regularly attend such concerts in a working capacity. Hearing damage can include loss of sensitivity at certain frequencies, or generally across the whole sound audio frequency spectrum (20 Hz to 20,000 Hz), or can cause hearing disabilities such as tinnitus. Often such damage is not appreciated by the victim at the time and further damage will occur because the victim will listen subsequently to audio signals at increased volume to compensate for the hearing loss already suffered. Damage is particularly acute in the higher frequency part of the audible range and such higher frequencies are very common at rock music concerts.

There is therefore a need for methods and devices which can control the audio dosage output of public broadcast systems used at concerts, and of other audio output systems.

BACKGROUND ART

Known systems for audio dosage control include U.S. Pat. No. 2,338,551, U.S. Pat. No. 4,254,303 and U.S. Pat. No. 4,306,115, which automatically adjust the output volume from loudspeakers to compensate for background noise levels.

In U.S. Pat. No. 4,583,245 a system is described to protect a speaker from damage by superimposing extra frequencies to control speaker diaphragm excursions.

EP 0 529 158 describes a method for attenuating the amplitude of a sound signal in frequency bands in which either the instantaneous intensities, or the cumulative sound dosage, exceed predetermined thresholds. This uses an array of one-third octave analogue fixed bandwidth stop-band notch filters which are triggered based on feedback from microphones monitoring a broadcast sound signal and comparing it to a target profile. A problem arises with this known method in that the amplitude of all audio components within a particular frequency band are attenuated (rather than just the component exceeding the threshold) and this leads to a degradation of the overall sound quality. In addition there is a variable time lag for the filtered sound depending on the number of filters and their attenuating bandwidth. This consistent time log produces undesirable audio effects such as tonal shifts degrading the sound quality. Also filtering occurs after the initial sound generation and an unfiltered burst of high amplitude passes before correction.

In addition, since an attenuation factor is determined by the peak within a frequency band, the actual attenuation applied could be more, or less, than the ideal required level and again unnecessary degradation of the overall sound quality tends to occur.

SUMMARY OF THE INVENTION

According to a first aspect of the present invention there is provided a method for controlling consumer exposure to audio dosage for a composite audio signal, the method comprising: sampling the composite audio signal; transforming the sampled audio signal, using a fast fourier transform algorithm, to produce a signal representative of the amplitude of component frequencies of the audio signal; comparing the transformed audio signal with a predefined impulse control threshold profile, representing the target maximum amplitude for each frequency component for the audio signal threshold profile, to produce a configuring signal representative of the difference between the broadcast signal and the profile; using the configuring signal to automatically configure in real time a Finite Impulse Response (FIR) filter so that it attenuates the amplitude of the transformed audio signal in frequency bands centred on the frequencies at which the target threshold is exceeded; and outputting the attenuated audio signal for consumer exposure.

This method has the advantage of coupling the audio signal monitoring fourier transform routines and the runtime filter design. The use of an FIR (Finite Impulse Response) filter is particularly advantageous. These are inherently stable digital filters implemented in software typically running on a digital signal processor (DSP). The software performs mathematical modelling algorithms, such as those defined by the known programme MATLAB (Registered Trade Mark), either to define the filter response from given input coefficients, or to define the coefficients from a given desired response. An FIR filter can be configured to emulate a very large number of very narrow frequency bandstop filters with considerable accuracy.

Effectively the desired response of the FIR filter for the invention is defined by the result of the comparison between the sampled composite audio signal, for example from a stage, and the desired target profile. The desired filter response is then used to calculate the coefficients of the filter for a particular frequency and these coefficients are used to process subsequent signals of that frequency: in this case to suppress or attenuate the signal of a particular frequency to decrease the amplitude value at that frequency. The filtering is put into effect immediately, i.e. before the sampled audio signal is passed to an output device such as a speaker for broadcast or an earpiece or the like for personal consumption, in a personal music player.

Preferably four or more sub-bands are employed for each bandwidth. This may be on a logarithmic scale.

Preferably the transformed audio signals which exceed the defined threshold profile are scaled according to a second aspect of the invention which is explained in more detail below, and for ease of reference will be called the "calibration method bin gain".

Since the live audio signals are used in real time to design the response curve of the FIR filter, the filtering is more accurately tailored to requirements than was possible in the known methods. This has significant advantages because the frequency components to be attenuated can be identified much more accurately than hitherto and the attenuation more accurately targeted. The invention can significantly reduce the incidence of unwanted attenuation of components, for example those close to the target frequency. The performance is thus much superior to known systems using fixed filters which have unequal attenuation across their frequency span. This applies to both analogue and digital filters and the error becomes more extreme at the limits of the frequency span. This error is commonly termed "side lobes". However the centre frequency of the FIR filter configured according to the invention matches the frequency component to be attenuated more accurately and thus such errors are greatly reduced.

According to a second aspect of the invention there is provided a system for controlling consumer exposure to audio dosage for a composite audio signal, the system comprising: means for sampling the composite audio signal; means for performing a fast fourier transform algorithm on the sampled signal to transform it into a signal representative of the amplitude of component frequencies of the audio signal; means for comparing the transformed audio signal with a predefined impulse control threshold profile, representing the target amplitude for each frequency for the broadcast audio signal, and producing a configuring signal representative of the difference between the broadcast signal and the profile; means for automatically configuring in real time a Finite Impulse Response (FIR) filter in accordance with the configuring signal so that the filter attenuates the amplitude of the transformed audio signal in frequency bands centred on the frequencies at which the target threshold is exceeded; and means for outputting the attenuated audio signal for consumer exposure.

One or more impulse control threshold profiles may be defined as a pre-calibration step in the method of the first aspect of the invention and they may be stored in a high speed Digital Signal Processor (DSP).

Such profiles may be generated wholly or in part using default values, such as values recommended by regulatory bodies. They may also be generated manually. Alternatively they may be generated automatically.

In one embodiment a pre-recorded sample is broadcast and recorded and used to generate a profile which, when used in the method of the first aspect, will cause attenuation levels to be adjusted to match the sample.

In another embodiment a profile is generated automatically by applying a plurality of different frequencies and amplitudes, sampling the respective output signals and using this to compile a matrix of calibration data to form the profile.

Thus according to a third aspect of the invention there is provided a method of defining an impulse control threshold profile comprising: broadcasting a plurality of frequency signals, including a plurality of amplitude levels at each frequency; sampling the broadcast signals at each frequency and amplitude and using the sampled signals to compile a matrix of calibration data for defining the profile.

The method of the third aspect can be used to define one or more profiles used in the first and/or second aspects.

Preferably this third aspect is affected by siting two microphones and respective preamplifiers at the closest position which a listener will occupy relative to audio channel loudspeakers, with the microphones separated laterally at an angle midrange of the loudspeaker propagation angle. This propagation angle is given in the manufacturers' specifications.

A corresponding system is also provided.

Each microphone is preferably arranged for a predetermined gain, i.e. is calibrated to provide a predetermined output compared to acoustic level input.

A programmable amplitude and frequency sine wave generator may be used to sweep in frequency and amplitude across the audio spectrum of 20 Hz to 20,000 Hz and is cycled in amplitude at each frequency test point. The acquired matrix of calibration data may be used to define the impulse control threshold profile to be compared with actual samples during a performance. This calibration matrix of bin gain for each FFT bin bandwidth represents the function of acoustical noise levels for electrical input levels at each bin frequency over a range of amplitudes.

This pre-calibration method can improve the impulse control accuracy because it uses actual measured audio channel outputs. Feedback during the performance or event is then not needed for instantaneous control of the audio dosage. However feedback would still be used where total dosage protection and attenuation curve control were still at issue.

A profile may also be generated manually making use of the skills of audio technicians and engineers in mixing audio signals, e.g. voice, instrumental and special effects (synthetic) elements, to obtain artistic effects in the final broadcast, providing an advantageous systemic latitude on user-variable selection of profiles.

Attenuation profiles may be produced by manually assigning tolerance values for frequency sub-ranges or bins typically in the range zero to 8.0 dB.

Default attenuation limits are preferably arranged to be proportional to a standard dBA-weighted scale. However the operator can preferably adjust these limits. For example, depending upon the nature of the audio broadcast and the effect to be achieved, he may wish to increase the threshold for attenuation of certain sub-bands and will then decrease the threshold for others in order to compensate and stay within a predetermined overall target threshold dosage. This target will be the calculated maximum total sound dose for the event, ie a target average sound level multiplied by the length of the event. This is known as the equivalent sound value or Leq. Such a maximum sound dose may be set by a standards authority such as the US safety and health administration (OSHA) and the Leq level can be compared to this to provide a percentage dose. OSHA currently recommend a maximum of 90 dBA averaged over 8 hours. Higher levels can be more easily tolerated over shorter periods of time.

Alternatively profiles may be determined by recording a composite signal over a predetermined time period, e.g. the time span of the desired enhancement, then assigning noise levels according to the degree of enhancement desired.

According to a fourth aspect of the invention there is provided a method of re-mastering pre-recorded audio signals. The method of this fourth aspect comprises: playing an audio sample, for example a sound track comprising a commercial form of recording such as a music or voice recording on an audio player; filtering the played audio sample using a plurality of finite impulse response (FIR) filters set at predetermined configurations; recording the filtered audio sample; replaying the recorded audio sample; using it to define a target impulse control threshold profile; and applying the defined profile to the means for controlling the volume of the played sample.

The profile may be a target limit dosage over a predetermined time period, for example a target mean volume level over the length of the sample, which may be the length of a sound track or a standard listening period. The profile is then applied to the means determining the volume at which the audio sample is played subsequently.

This aspect of the invention has particular application in personal portable audio players which are traditionally listened to via earphones at sometimes damaging volume levels. Current popular examples of such players are solid state and miniature hard disk players recording audio signals in compressed formats such as that known as MP3 format. However it can be used with a variety of compression techniques and player formats without substantial modification.

In such players volume controls are governed by software routines such as the CODEC (coder-decoder) files which are currently used to balance volume levels between compression formats, such as between CD and MP3 formats. The defined target profile can be applied to volume control entries in the CODEC files of the compressed recording to ensure that the broadcast audio sample complies with the profile, i.e. that the target mean volume level is observed.

This method can be applied to the compressed recording or may be applied to the audio player itself. On a commercial level, when a recording and/or audio player is equipped to enact this method, it could be endorsed with an identification symbol. Thus people who are concerned about inadvertently exceeding recommended audio levels will be re-assured that an overall recommended limit is not exceeded.

DETAILED DESCRIPTION OF FIGURES

Figure 1:
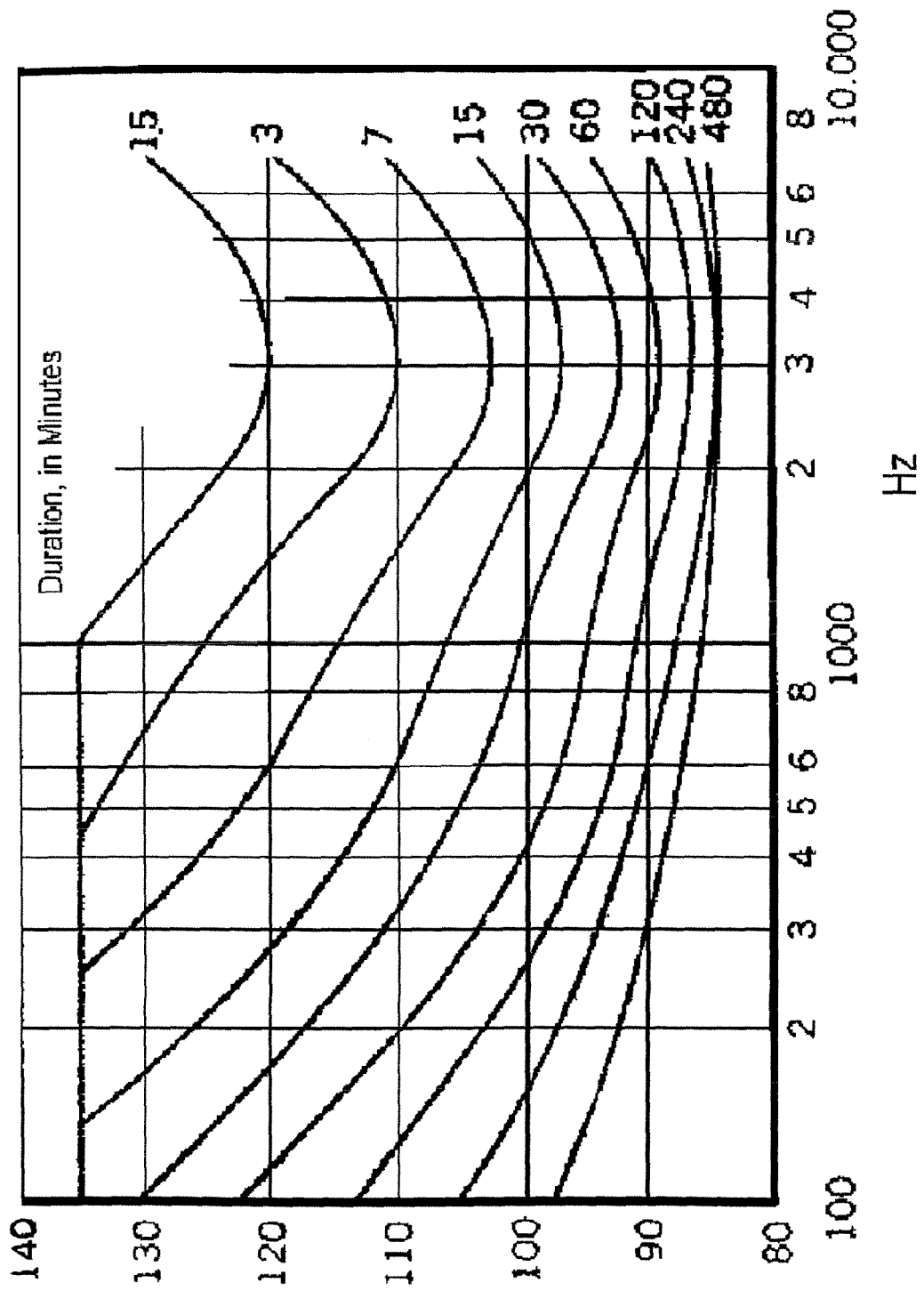
FIG. 1 is a graph illustrating recommended maximum audio doses for different frequencies.

Governmental and regulatory authorities such as the US Occupational, Safety and Health Act (OSHA) have published recommended noise exposure limits. The OSHA chart is shown in FIG. 1 which plots frequency horizontally in Hertz (Hz) on a logarithmic scale, against volume in decibels (dB) on the left hand side vertical axis, and indicates the recommended maximum exposure time in minutes on the right hand side vertical axis, for each combination of frequency and volume.

The lower values of frequency, to the left of the graph, represent sounds of lower pitch, and the higher frequency values, i.e. higher pitch, are to the right. For example floor vibrations are about 20 Hertz, guitar sounds and vocal sounds would be up to about 1000 Hz. Frequencies above 10,000 Hz would sound like squeels. The amplitude or loudness scale varies from 30 dB (SPL) representing a whisper, through normal conversation at about 45 dB (SPL), through shouting at about 80 dB (SPL) to the upper levels of human tolerance including the sound of a jet aircraft taking off (about 120 dB SPL)) and the generally accepted threshold of pain at the top end of the scale (140 dB (SPL It will be seen that the recommended limits vary considerably. Lower frequencies can be tolerated at higher levels for much longer than higher frequencies, particularly at high levels. So, for example, the recommended maximum dose of sound at 300 Hz varies from about 480 minutes at 90 dB (SPL), to only 7 minutes at 130 dB (SPL). At 120 dB (SPL) the frequency 100 Hz can be tolerated for 60 minutes but the higher frequency of 3000 Hz can be tolerated for only 1.5 minutes. Of course safe limits will vary between individual members of the audience and these recommendations are for general guidance only.

Such regulatory body recommendations can be used as a basis for defining predetermined threshold profiles to be used in this invention.

Figure 2:
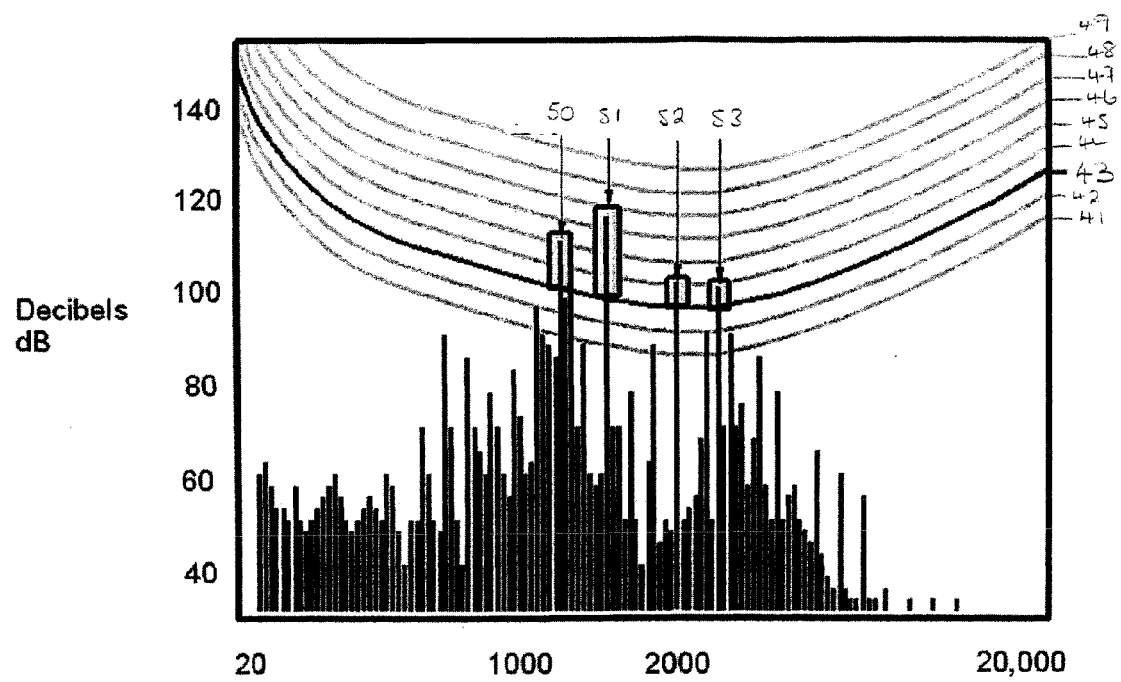
FIG. 2 is a graph illustrating one way in which the present invention may be applied.

FIG. 2 is a snapshot of a typical audio spectrum at one particular point in time as a graph of amplitude (level of volume) in decibels on the vertical axis, against frequency (pitch) in Hertz plotted on a logarithmic scale horizontally.

A set of curves is shown in the top part of the graph representing threshold profiles which can be applied by the system of the present invention to set attenuation levels for the monitored signal to be broadcast. These curves are based generally on the OSHA curves shown in FIG. 1. Thus, for example, if curve 43 is applied as the threshold profile then the frequency components shown at 50, 51, 52 and 53 will be attenuated by the indicated amounts to bring them into line with the curve 43. Thus the frequency 51 is attenuated most, frequency 50 is attenuated the next most and frequencies 52 and 53 attenuated only a small amount.

By targeting individual frequency components and using a carefully defined profile, the present invention is able to attenuate the most dangerous frequencies by only the necessary amount to render the sound safe. It can be seen from FIG. 2 that there is no need to attenuate the majority of frequencies. Hence the overall effect of the inventive method does not represent a noticeable volume reduction to the audience but does reduce the risk of hearing damage significantly.

The level of the profile curve can be chosen and is altered during the performance depending upon the instantaneous calculated total audio dose. Thus if the system calculates that the total audio dose, through the projected length of the concert, will be likely to exceed the recommended value then the profile curve will be moved "down", i.e. to one of curves 41 or 42 in the example of FIG. 2. If the total calculated dose is below the total recommended value then a "higher" curve will be used, i.e. one of curves 44 to 49.

The total projected dose during the whole concert is calculated as a percentage of the target total and is known as the percentage L EQ dose. It can be displayed to the sound engineers continuously, for example in the form of a petrol gauge type display with an arrow indicating how much of the total target dose has been used, and/or a graphic display of the instantaneous audio output, or that of the previous five minutes, compared to the average for the whole concert.

Figure 3:
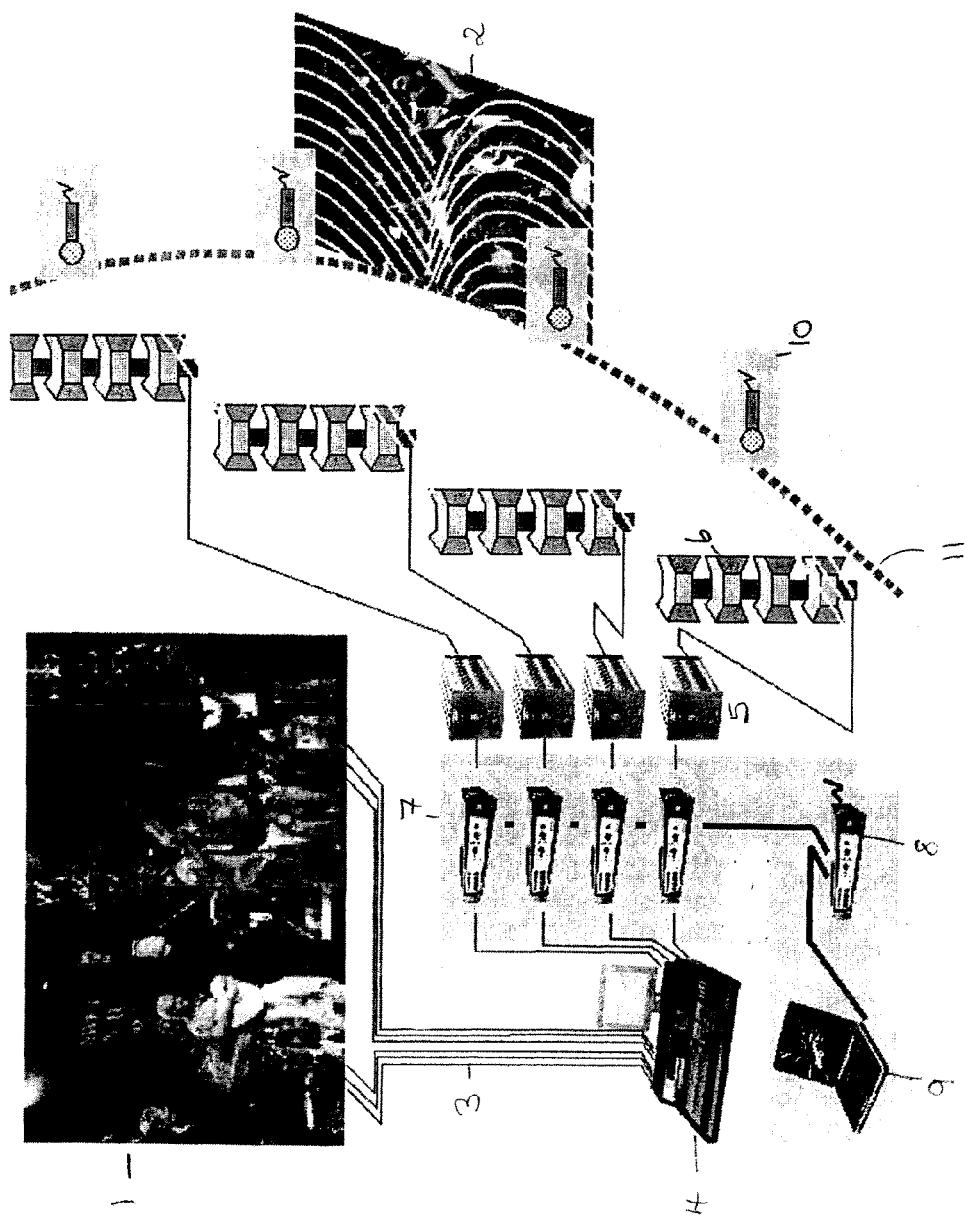
FIG. 3 is a schematic diagram illustrating the present invention in use at a concert.

FIG. 3 illustrates use of this invention at a concert. Typically a band 1 performs on a stage in front of an audience 2. The band 1 sings and plays instruments and thus has a variety of instrumental and vocal outputs which are picked up by microphones and electronic instrument pick-ups. The corresponding electronic audio signals are fed along wires 3 to a mixing unit 4, then typically to amplifiers 5 and then to speakers 6, to broadcast the mixed and amplified sound of the band 1 to the audience 2.

The mixing unit 4 may be an analogue or a digital unit and is typically manned by experienced sound technicians who vary the comparative intensities of different components of the monitored sound of the band 1 so that the broadcast signal is acceptable to the audience: for example the vocal frequencies may be enhanced so as to be heard clearly over some of the instrumental sounds. Alternatively, for certain types of music, bass sounds may be enhanced.

The mixing unit 4 is connected to a set of post-mixers which act as control units 7, one post-mixer control unit corresponding to each of the amplifiers 5, and the control units are all connected to a central integration unit 8 which is connected to a computing device such as a laptop computer 9. In addition, a set of feedback microphones 10 are placed amongst the audience 2, preferably at intervals along the boundary 11 of the audience 2 closest to the speakers 11, so as to sample the highest sound level heard by the audience 2. The feedback microphones 10 are preferably wireless enabled and transmit signals, representing the sound levels at the boundary 11, back to respective control units 7 and to the integration unit 8. Of course the microphones may be hardwired or transmit by other means. They may be suspended above the boundary 11, for example from a ceiling if available, or from gantries which may have been erected to hold lighting equipment. Alternatively they may be placed in crowd barriers.

The integration unit 8 processes the signals from the feedback microphones 10 and computes accumulated sound dosage projections in real time, at regular, e.g., one minute, intervals. The laptop computer 9 provides information to the sound technicians of current sound doses, and it also stores target threshold profiles and computes projections.

The control units 7 effectively compare the sound signals received from the mixing unit 4 with a predetermined threshold target profile and attenuate elements of the sound signals which exceed the threshold profile. Their operation will be understood more fully from a consideration of the flow diagram of FIG. 4.

Inputs to the control units 7 will usually be digital signals but any analogue signals will in any case be digitised.

Figure 4:
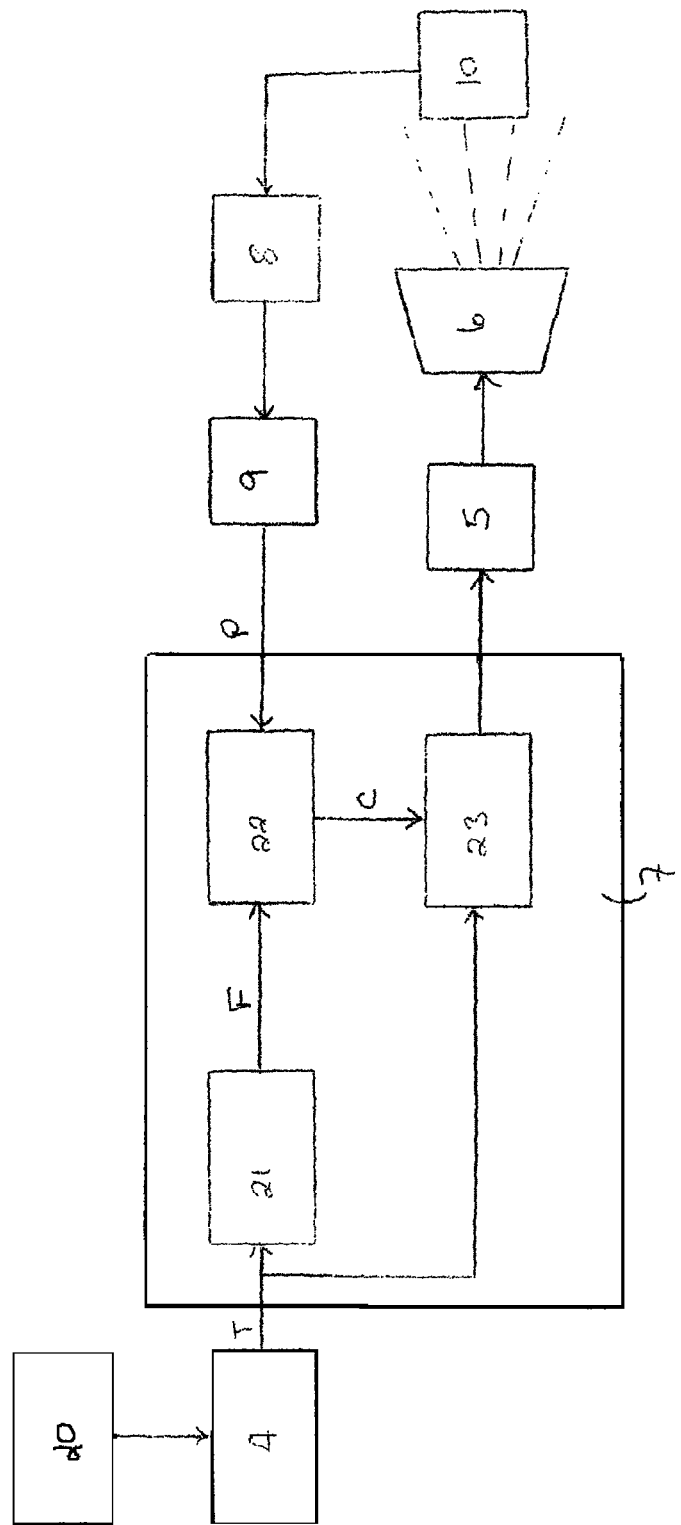
FIG. 4 is a block diagram illustrating the system of the invention.
Figure 5:
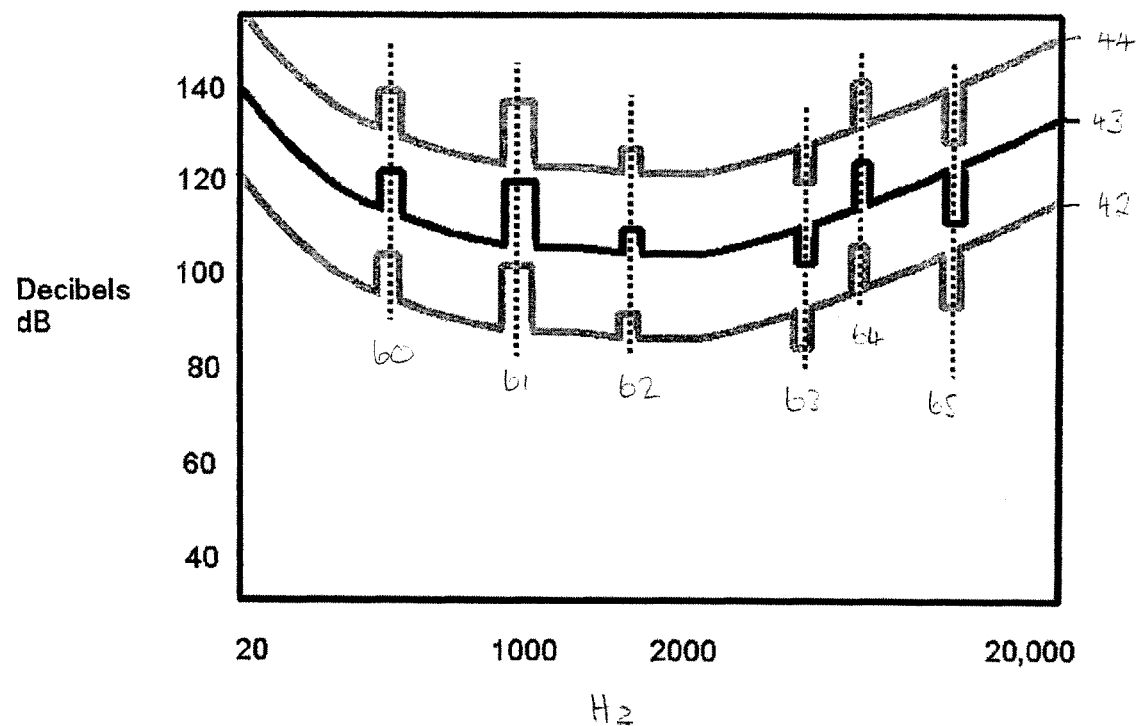
FIG. 5 is a graph illustrating a second way in which the present invention may be applied.

In FIG. 4 the microphones and pick-ups on stage are represented at box 20 and they provide electronic signals to the mixing unit 4 which provides a time domain signal T to the control unit 7. The control unit 7 includes firmware 21 which performs a Fast Fourier Transform (FFT) operation on the time domain signal T to convert it to a frequency domain signal F, i.e. to provide a spectrum indicating the amplitude of a spectrum of frequency values, such as is shown in FIG. 5 which is described later.

The control unit 7 includes a comparator 22 which compares the frequency spectrum generated by the Fast Fourier Transform operation, with a threshold profile P supplied by the laptop computer 9. The comparator 22 identifies those frequencies for which the instantaneous amplitude exceeds that determined by the threshold and outputs a configuration signal C representative of those frequencies. This configuration signal C is applied to a configurable filter 23, which preferably comprises a Finite Impulse Response (FIR) filter. FIR filters are configurable in real-time so as to attenuate the amplitude of a signal occupying a frequency band centred on the precise frequency of the component which exceeds the threshold. The configured FIR filter 23 is then used to attenuate the amplitude of the time domain signal T and the filtered signal is broadcast via the amplifiers 5 and speakers 6.

Figure 6:
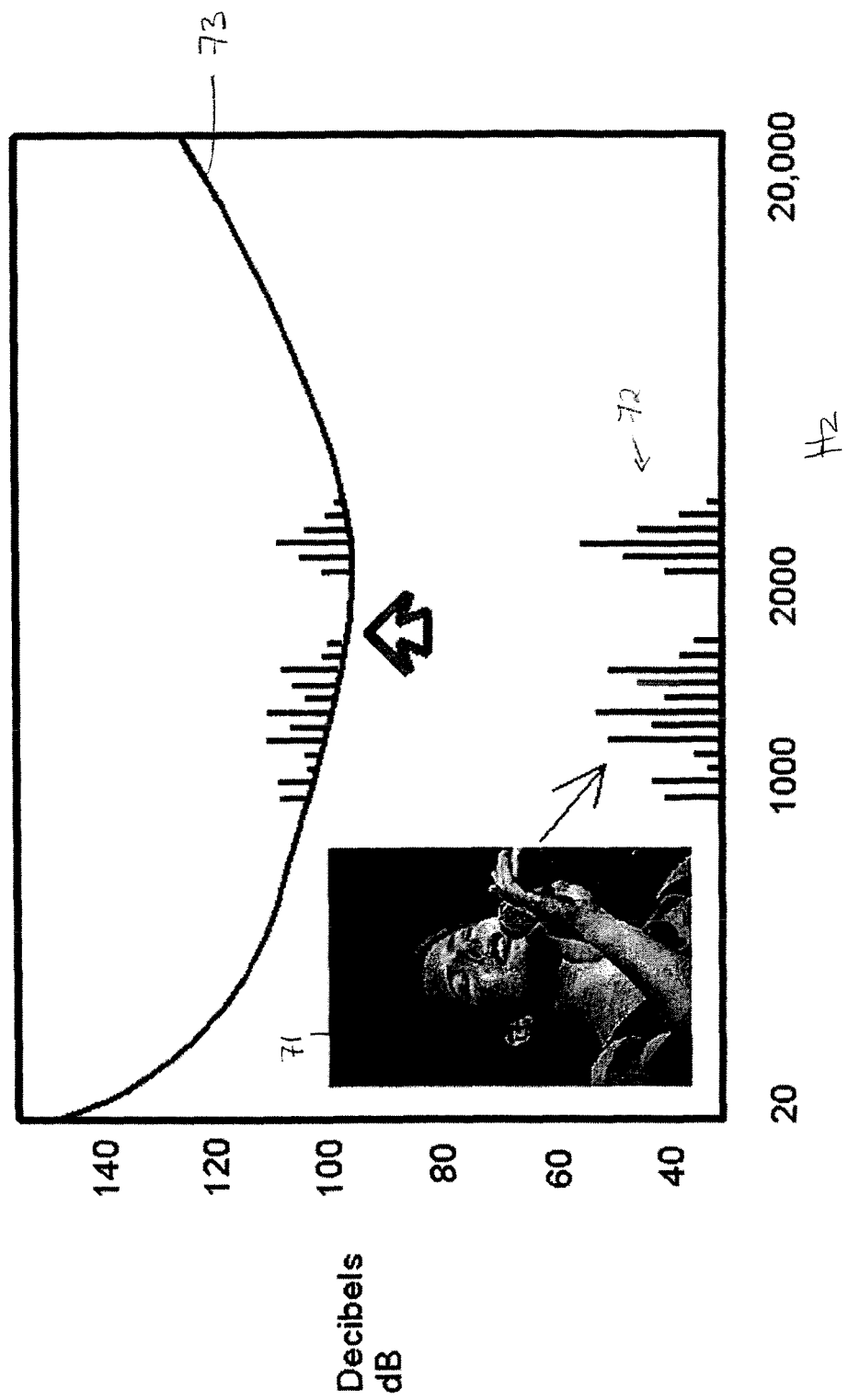
FIG. 6 illustrates a variation of the second embodiment.

FIG. 4 also illustrates one method of generating a particular threshold profile P. The sound broadcast from speaker 6 is monitored by at least one feedback microphone 10 which is preferably placed at the boundary of the audience closest to the speaker or speakers as shown in FIG. 3. The signal from the feedback microphone or microphones 10 is supplied via integrator 8 to the laptop computer 9 where it is analysed to determine a typical sound profile for the particular act being performed. This may be, for example, as shown in FIG. 6 which is described later. The typical profile may then be added to a predetermined attenuation curve, such as those illustrated in FIG. 2 to produce a composite profile P, which is applied to the comparator 22 in the control unit 7.

In EP 0 529 158A an analogue example of this is illustrated in which the audible frequencies are divided into 16 frequency bands and signals are produced representing the average amplitude of each band. The present invention uses digital technology and is effectively able to provide a far more accurate representation of the audible spectrum, and the amplitude of each frequency component.

The invention can also provide a way in which the sound engineer can tailor the threshold profile, used in the attenuation, to allow certain exemptions. For example, he may wish to allow a lead vocal or the lead guitar to be emphasised compared to the default profile. To this end the computer 9 can be set to allow certain relatively specific frequency bands to reach higher amplitude levels than the default threshold profile would otherwise permit. This is shown in FIG. 5 where the threshold curves 42 to 44 are modified in frequency sub-bands 60 to 65. This might be, for example, to pass a lead guitar rip at 60, emphasise a lead vocal at 61, emphasise a second vocal at 62, de-emphasise feedback at 63, pass the sound of cymbals at 64 and de-emphasise feedback at the higher frequency at 65. Typically the modification would be in the range of +8 dB, allowing louder levels at a frequency, to −12 dB, reducing the loudness level. This is of course only one example of the sort of pre-configuration which the present invention allows.

The exemption profile can be manually entered by an experienced sound engineer but more preferably it is generated automatically from a previously recorded or an instantaneously sampled element of the concert programme. For example a particular vocalist may have a distinctive voice profile which it is desired not to alter by attenuation. Thus a sample of the vocalist's performance may be taken and fed into the laptop computer 9 which will use it to superimpose on the default threshold profile curve. This is illustrated in FIG. 6 where a sample of the vocal of a female singer 71 is shown as a frequency versus amplitude plot at 72, and is shown superimposed on the chosen threshold curve, e.g. 43 from FIG. 2, to produce the composite profile 73.

The profile 72 could be generated during the concert by samples taken from the feedback microphones 10.

Figure 7:
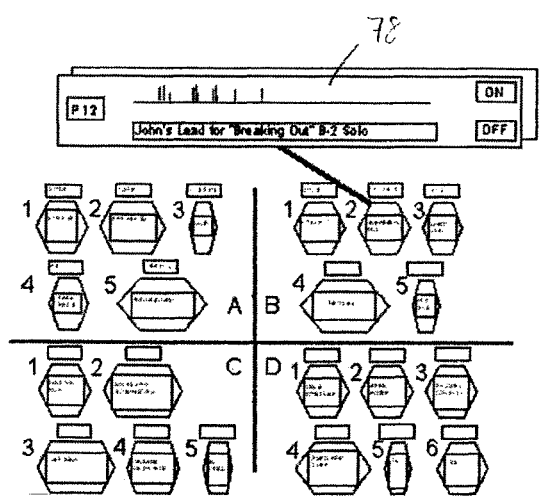
FIG. 7 illustrates a control screen display for use with the invention.

FIG. 7 is an example of a screen display on the laptop computer 9 indicating the selection of attenuation profiles available to the sound engineer during the concert, to allow careful coordination of the profiles to particular bands and songs. For example the screen may be divided into four sections A, B, C and D corresponding to four different bands performing in the concert, and each song may be numbered 1 to 5 as shown. A pop-up display box may be available such as that shown at 78 for song 2 of band B. This box 78 gives more details of the song, for example "John's lead for "Breaking Out" B-2 solo" and will show a sample of the profile to be superimposed on the default curve (say 43 in FIG. 4) when the profile is turned "on". This form of display and storage of particular profiles allows complete flexibility for the sound engineer to adapt to changes in performance times or sequences during the concert.

The invention allows sound engineers full effective control of the applied attenuation so that particular artistic content and special effects can be maintained.

Digital master recordings of the concert performance can be generated from the signals before broadcast, which is advantageous because these recordings are free of incidental noise and are ready for studio re-mastering as required.

The invention can also be used for digitally re-mastering recorded music particularly that commercially sold in compressed form such as CD or MP3 format, and typically played on personal portable audio players.

An audio sample is played on a benchmark audio player and the output is filtered using finite impulse response (FIR) filters set a default or predetermined values. The filtered output is then used to define a target profile determining the mean volume level meeting the target profile and this is applied to the CODEC files of the compressed recording. This can be done using one post-mixer control unit such as that shown at 7 in the figures, for each sound track, and the central integration unit.

In an enhanced form of the invention, illustrated in FIGS. 8 and 9, low frequencies, preferably below 100 Hz are excluded from the signal processing and allowed to pass through as a base carrier. This reduces the propagation delay and reduces distortions in the output which can occur due to step changes occurring at the start and stop of lowest filter applications.

The four reverse FFT buffers are added to the base carrier to form the composite audio output signal. Typically the propagation delay can be reduced to 85 milliseconds for the lowest range, 43 milliseconds for the second, 21 milliseconds for the third and five milliseconds for the fourth.

Any very low frequencies contributing adversely to the accumulated dose can be managed by a simple attenuator after the buffer summations but such low frequencies typically contribute less than 1% of the typical overall audio dose so this is not significant.

Figure 8:
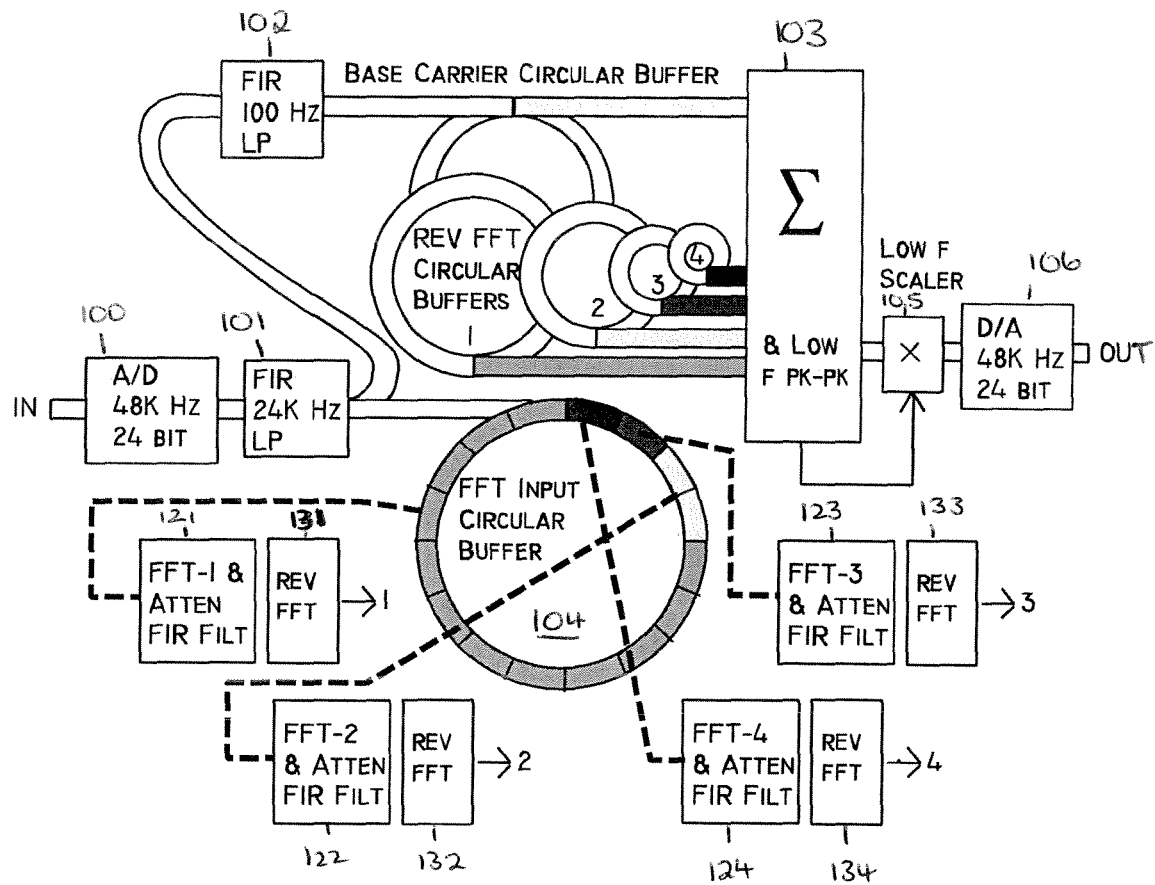
FIG. 8 illustrates a method according to a second embodiment of the invention.

In FIG. 8 this adapted method is shown schematically. The input composite signal IN is converted to digital by the 24 bit A/D converter 100 operating at 48 KHz and filtered by a 24 KHz FIR filter 101. The lowest frequencies, below 100 Hz are allowed to pass through FIR filter 102 and form a base carrier signal which is input to a summation module 103. Frequencies above 100 Hz are subject to the method of the invention, i.e. they undergo the process of disassembly, using fast fourier transform algorithms and FIR filtering, in the FFT input circular buffer 104 which operates in four ranges 1, 2, 3 and 4 as shown between 100 Hz and 24 KHz. The ranges are transformed and attenuated in respective modules 121, 122, 123 and 124 and are reverse transformed by respective modules 131, 132, 133 and 134 and the resulting signals in the four ranges are then applied to the summation module 103 to be added to the base carrier. The summed signal is then scaled via a low frequency scaler 105 and converted to analogue in D/A converter 106 to form to output signal OUT.

The spacing of the four ranges is based upon accepted perceptual coding practices. Each range defines a sample segment, a sample pre-conditioning such as zero-stuffing, a full complex FFT run and dB magnitude comparisons with frequency domain harmonic filtering.

Figure 9:
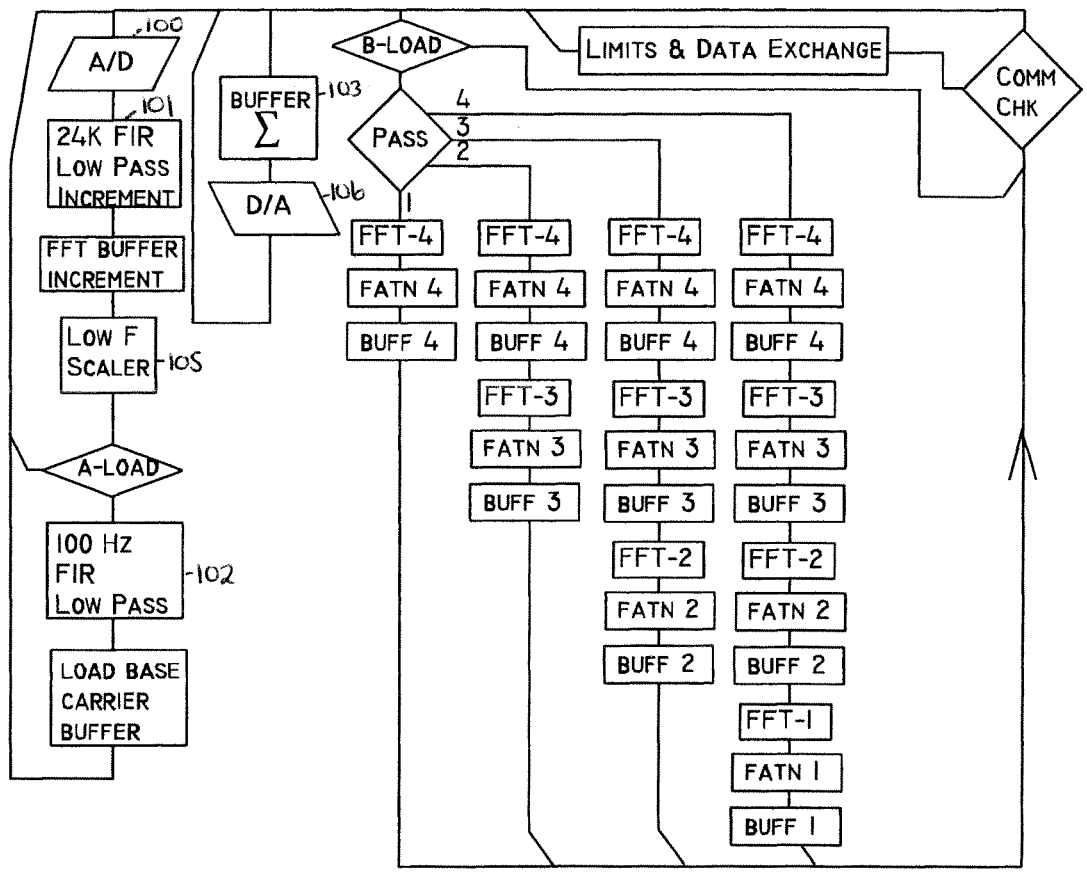
FIG. 9 is a simplified time based diagram illustrating the software processing order for the method illustrated in FIG. 8.

FIG. 9 is a simplified time based diagram illustrating the key software processing order of operations for the method illustrated in FIG. 8. Of course sampling frequencies and range data overlap values are given as examples only and will be optimised for particular applications. Such optimism can be assisted by maintaining a Configuration Parameter set in memory to permit a program manager PC to make alterations.

The schematic of FIG. 9 incorporates the same elements as FIG. 8 and like reference numbers have been used. A list of programme routine descriptions follows:

Programme Routines Descriptions

A/D 48 KHz., 24 Bit Sampling of Audio Channel. This is a continuous background routine which loads incoming conversions to a receiving circular buffer.

24K FIR This is a 4095-sample FIR Low Pass Filter with 0.02 dB pass band ripple and 60 dB stop band rejection used as a general anti-aliasing filter. The filter incrementally operates on the receiving circular buffer with a coefficient set with the resulting output saved to the FFT Circular Buffer and the Base Carrier Signal Circular Buffer.

100 FIR This is a 4095-sample FIR Low Pass Filter with 0.02 dB pass band ripple and 60 dB stop band attenuation used to remove all but Base Carrier Circular Buffer components.

Buffer▼ A summation routine which sums the Base Carrier, FFT-1 Reverse, FFT-2 Reverse, FFT-3 Reverse, and FFT-4 Reverse circular buffer elements. This routine also maintains a peak dynamic range update which applies a low frequency scale adjustment for any necessary bass attenuation.

D/A 48 KHz., 24 Bit Output of Attenuated Audio Channel. This is a continuous background routine which loads from the Buffer Summation routine and outputs the immediate analogue level.

A-Load This is a test branch which checks the position of the receiving circular buffer load to initiated a reload of the Base Carrier Signal Buffer with filtering.

B-Load This is a test branch which checks the position of the FFT Circular Buffer to time the four ranges of FFT calculations on alternate executions as shown in the Pass selection.

FFT-4 The highest frequency FFT routine operates on the FFT Circular Buffer with specified alternate sampling and zero stuffing.

FATN-4 The useable bin frequency range of the FFT-4 spectrum are compared to the immediate attenuation profile (received from the Program Manager) and any bins exceeding the profile are reduced to the profile level.

BUFF-4 The attenuated FFT-4 spectrum is adjusted for time domain alignment, the reverse FFT is run on the reduced spectrum and the result is loaded to the FFT 4 Circular Buffer summation output.

FFT-3 The mid-high frequency FFT routine operates on the FFT Circular Buffer with specified alternate sampling and zero stuffing.

FATN-3 The useable bin frequency range of the FFT-3 spectrum are compared to the immediate attenuation profile (received from the Program Manager) and any bins exceeding the profile are reduced to the profile level.

BUFF-3 The attenuated FFT-3 spectrum is adjusted for time domain alignment, the reverse FFT is run on the reduced spectrum and the result is loaded to the FFT 4 Circular Buffer for summation output.

FFT-2 The mid-low frequency FFT routine operates on the FFT Circular Buffer with specified alternate sampling and zero stuffing.

FATN-2 The useable bin frequency range of the FFT-2 spectrum are compared to the immediate attenuation profile (received from the Program Manager) and any bins exceeding the profile are reduced to the profile level.

BUFF-2 The attenuated FFT-2 spectrum is adjusted for time domain alignment, the reverse FFT is run on the reduced spectrum and the result is loaded to the FFT 4 Circular Buffer for summation output.

FFT-1 The low frequency FFT routine operates on the FFT Circular Buffer with specified alternate sampling and zero stuffing.

FATN-1 The useable bin frequency range of the FFT-1 spectrum are compared to the immediate attenuation profile (received from the Program Manager) and any bins exceeding the profile are reduced to the profile level.

BUFF-1 The attenuated FFT-1 spectrum is adjusted for time domain alignment, the reverse FFT is run on the reduced spectrum and the result is loaded to the FFT 4 Circular Buffer for summation output.

COMM Chk This is a test branch to find if communications interrupt has occurred since the last pass due to Program Manager data query.

EXCHG This routine handles the serial data exchange of incoming profile band limits and outgoing immediate levels.

The invention claimed is:

1. A method for controlling consumer exposure to audio dosage for a composite audio signal, the method comprising:
sampling the composite audio signal;
transforming the sampled audio signal, using a fast fourier transform algorithm, to produce a signal representative of the amplitudes of plural different component frequencies of the sampled audio signal;

defining an impulse control threshold profile representing a target maximum amplitude for each of the plural different component frequencies;

comparing the transformed audio signal with the impulse control threshold profile to produce a configuring signal representative of the difference between the transformed audio signal and the impulse control threshold profile;

using the configuring signal automatically, in real time, to configure the response curve of a Finite Impulse Response (FIR) filter that attenuates the amplitudes of the transformed audio signal in frequency bands centered on the respective ones of the plural different component frequencies at which the target maximum amplitude is exceeded; and outputting the attenuated audio signal for consumer exposure.

2. A method according to claim 1 further comprising using a digital signal processor for configuring the FIR filter.

3. A method according to claim 2 further comprising setting the time period for the fourier transform algorithm to be substantially the same as said lowest period of the bandwidth of the composite audio signal.

4. A method according to claim 1 further comprising identifying the frequency components of the transformed audio signal which have an amplitude exceeding the respective target maximum amplitude.

5. A method according to claim 1 wherein the impulse control threshold profile is at least partly defined by a default profile determined by the audio dosage for each frequency as recommended by a regulatory authority.

6. A method according to claim 1 wherein the impulse control threshold profile is at least partly defined manually by an operator establishing the threshold profile according to a desired broadcast output signal.

7. A method according to claim 1 wherein the impulse control threshold profile is at least partly defined by the steps of broadcasting an audio sample for the impulse control threshold profile, monitoring the broadcast audio sample, and configuring a computer to match the audio sample.

8. A method according to claim 1 further comprising the step of enabling operator override of the attenuation of the amplitude of the broadcast signal at one or more frequency.

9. A method according to claim 8 comprising the step of compensating for any manual override of the attenuation of any one frequency by automatically attenuating the amplitude of at least one other frequency.

10. A method according to claim 1 further comprising generating a pre-calibration matrix of broadcast signal output versus input amplitude for each frequency without attenuation.

11. A method according to claim 1 comprising defining in the impulse control threshold profile a maximum audio level dose over a predetermined time period.

12. A method according to claims claim 1 wherein frequencies below about 100 Hz are excluded from the steps of transforming, comparing, configuring, and attenuating and are added to the attenuated audio signal for consumer exposure.

13. A system for controlling consumer exposure to audio dosage for a composite audio signal, the system comprising:

means for sampling the composite audio signal;

means for performing a fast fourier transformer algorithm on the sampled audio signal to transform the sampled audio signal into a transformed audio signal representative of the amplitudes of plural different component frequencies of the sampled audio signal;

means for comparing the transformed audio signal with a predefined impulse control threshold profile representing target maximum amplitudes for each of the plural different component frequencies to produce a configuring signal representative of the difference between the transformed audio signal and the impulse control threshold profile;

a Finite Impulse Response (FIR) filter; and means for configuring the FIR filter in accordance with the configuring signal and using the configured FIR filter to attenuate the amplitudes of the transformed audio signal in frequency bands centered on the respective ones of the plural different component frequencies at which the target maximum amplitude is exceeded.

14. A system according to claim 13 further comprising means to measure the lowest period of the bandwidth of the composite audio signal.

15. A system according to claim 14 further comprising setting the time period for the fourier transform algorithm to be substantially the same as said lowest period.

16. A system according to claim 13 wherein the predefined impulse control threshold profile defines, at least in part, a default profile determined by the audio dosage for each frequency as recommended by a regulatory authority.

17. A system according to claim 13 further comprising means for an operator to manually intervene to establish the impulse control threshold profile according to a desired broadcast output signal.

18. A system according to claim 13 further comprising means for broadcasting an audio sample of the impulse control threshold profile, means for monitoring the broadcast audio sample, and means for configuring a computer to match the audio sample.

19. A system according to claim 13 further comprising means for enabling operator override of the attenuation of the amplitude of the broadcast signal at one or more frequency.

20. A system according to claim 19 comprising means for compensating for any manual override of the attenuation of any frequency by automatically attenuating the amplitude of at least one other frequency.

21. A system according to claim 13 further comprising a digital signal processor for storing the predefined impulse control threshold profile.

* * * * *

UNITED STATES PATENT AND TRADEMARK OFFICE
CERTIFICATE OF CORRECTION

PATENT NO. : 8,431,957 B2  Page 1 of 1
APPLICATION NO. : 12/066850
DATED : April 30, 2013
INVENTOR(S) : Kim Lovejoy It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1321 days.

Signed and Sealed this
Eighth Day of September, 2015

Michelle K. Lee
*Director of the United States Patent and Trademark Office*